US008067766B2

(12) United States Patent
Hsu et al.

(10) Patent No.: US 8,067,766 B2
(45) Date of Patent: Nov. 29, 2011

(54) MULTI-LEVEL MEMORY CELL

(75) Inventors: Yen-Ya Hsu, Taipei (TW); Chih-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 132 days.

(21) Appl. No.: 12/335,538

(22) Filed: Dec. 16, 2008

(65) Prior Publication Data

US 2010/0102306 A1 Apr. 29, 2010

(30) Foreign Application Priority Data

Oct. 24, 2008 (TW) .............................. 97140924 A

(51) Int. Cl.
*H01L 29/08* (2006.01)

(52) U.S. Cl. ............ 257/42; 257/E21.002; 257/E29.088
(58) Field of Classification Search .................... 257/42, 257/E21.002, E29.088
See application file for complete search history.

(56) References Cited

U.S. PATENT DOCUMENTS

| 6,555,865 | B2 | 4/2003 | Lee et al. |
| 6,855,979 | B2 | 2/2005 | Sadd et al. |
| 7,012,004 | B2 | 3/2006 | Tseng et al. |
| 7,037,762 | B2 | 5/2006 | Joo et al. |
| 7,235,848 | B2 | 6/2007 | Jeng |
| 2005/0112896 | A1 | 5/2005 | Hamann et al. |
| 2006/0063339 | A1 | 3/2006 | Hsiao et al. |
| 2006/0076641 | A1 | 4/2006 | Cho et al. |
| 2006/0257787 | A1 | 11/2006 | Kuo et al. |

*Primary Examiner* — Matthew Reames
(74) *Attorney, Agent, or Firm* — Jianq Chyun IP Office

(57) ABSTRACT

A multi-level memory cell having a bottom electrode, a first dielectric layer, a plurality of memory material layers, a plurality of second dielectric layers, and an upper electrode is provided. The bottom electrode is disposed in a substrate. The first dielectric layer is disposed on the substrate and has an opening exposing the bottom electrode. The memory material layers are stacked on a sidewall of the first dielectric layer exposed by the opening and are electrically connected to the bottom electrode. The second dielectric layers are respectively disposed between every adjacent two memory material layers and are located on the sidewall of the first dielectric layer. The upper electrode is disposed on the memory material layers. A manufacturing method of the multi-level memory cell is further provided. A multi-bit data can be stored in a single memory cell, and both the process complexity and the cost are reduced.

20 Claims, 5 Drawing Sheets

MULTI-LEVEL MEMORY CELL

CROSS-REFERENCE TO RELATED APPLICATION

This application claims the priority benefit of Taiwan application serial no. 97140924, filed on Oct. 24, 2008. The entirety of the above-mentioned patent application is hereby incorporated by reference herein and made a part of specification.

BACKGROUND OF THE INVENTION

1. Field of the Invention

The present invention generally relates to a semiconductor device, and more particularly, to a multi-level memory cell and a manufacturing method thereof.

2. Description of Related Art

Memory devices developed based on semiconductor techniques, such as dynamic random access memory (DRAM), static random access memory (SRAM), and non-volatile memory, have taken a major part in today's semiconductor industry. These memories have been broadly applied to personal computers, mobile phones, and networks and have become one of the most indispensable electronic products in our daily life.

The demand to memories having low power consumption, low cost, high access speed, small volume, and high capacity has been increasing drastically along with the widespread of consumable electronic products and system products. Among existing memories, the memory which records data by changing the resistivity of a variable-resistance layer is one of the most focused memory devices.

In a resistive random access memory (RRAM), the state of a variable-resistance layer is changed by applying a current pulse and a conversion voltage, so as to switch between a set state and a reset state according to different resistances. The digital data "0" and "1" is recorded in the memory according to the set and reset states corresponding to different resistances.

However, the conventional RRAM cannot be served as a multi-level memory. Additionally, because memory devices are made very small, the process complexity and cost thereof are greatly increased. Thus, how to reduce the surface area of an integrated circuit so as to increase the integrity of a memory and reduce the cost thereof is to be resolved.

SUMMARY OF THE INVENTION

Accordingly, the present invention is directed to a multi-level memory cell which allows a multi-bit data to be stored in a single memory cell.

The present invention is directed to a manufacturing method of a multi-level memory cell which simplifies the manufacturing process of the multi-level memory cell and reduces the cost thereof.

The present invention provides a multi-level memory cell including a lower electrode, a first dielectric layer, a plurality of memory material layers, a plurality of second dielectric layers, and an upper electrode. The lower electrode is disposed in the substrate. The first dielectric layer is disposed on the substrate and has an opening which exposes the lower electrode. The memory material layers are stacked on a sidewall of the first dielectric layer exposed by the opening and are electrically connected to the lower electrode. The second dielectric layers are respectively disposed between every adjacent two of the memory material layers and are located on the sidewall of the first dielectric layer exposed by the opening. The upper electrode is disposed on the memory material layers. Thereby, a multi-bit data can be stored in a single memory cell.

The present invention provides a manufacturing method of a multi-level memory cell. The method includes following steps. First, a substrate is provided, wherein a lower electrode is already formed in the substrate. Then, a dielectric layer is formed on the substrate, and an opening is formed in the dielectric layer to expose the lower electrode. Next, a first memory material layer is formed on the substrate, and a first spacer is formed on a sidewall of the first memory material layer. Thereafter, a second memory material layer is formed on the first memory material layer and the first spacer, and a second spacer is formed on a sidewall of the second memory material layer. After that, a third memory material layer is formed on the second memory material layer and the second spacer, and an upper electrode is formed on the third memory material layer.

In the present invention, multiple memory material layers and spacers for separating these memory material layers are formed in a single memory cell such that a multi-bit data can be stored in the single memory cell. Besides, the memory material layers may be made of different materials or have different thicknesses to distinguish different levels.

In a multi-level memory cell provided by the present invention, if spacers formed through a self-aligned process are served as dielectric layers for separating multiple memory material layers, steps in a photolithography process and the difficulty in photolithography exposure are reduced.

In a manufacturing method of a multi-level memory cell provided by the present invention, because spacers formed through a self-aligned process are served as dielectric layers for separating multiple memory material layers, steps in a photolithography process and the difficulty in photolithography exposure are reduced, and accordingly the cost of the multi-level memory cell is also reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
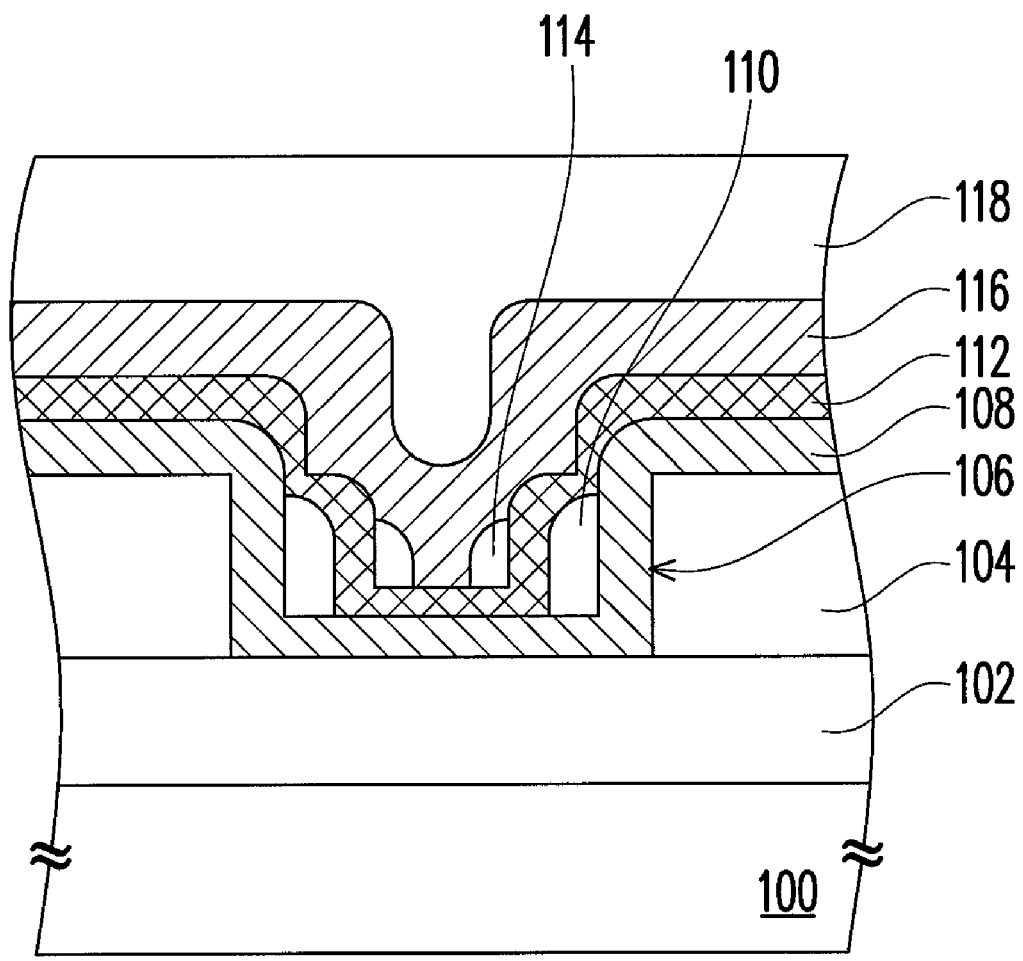
FIG. 1 is a cross-sectional view of a multi-level memory cell according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a multi-level memory cell which includes a lower electrode, a first dielectric layer, a plurality of memory material layers, a plurality of second dielectric layers, and an upper electrode. The lower electrode is disposed in the substrate. The first dielectric layer is disposed on the substrate and has an opening which exposes the lower electrode. The memory material layers are stacked on a sidewall of the first dielectric layer exposed by the opening and are electrically connected to the lower electrode. The second dielectric layers are respectively disposed between every adjacent two of the memory material layers and are located on the sidewall of the first dielectric layer exposed by the opening. The second dielectric layers may be formed as a plurality of spacers. The upper electrode is disposed on the memory material layers. In the present invention, a memory material refers to a material whose resistance is changed when a current is passed through, such as a variable-resistance material or a phase-change material.

In the present invention, a plurality of (three or more) memory material layers and dielectric layers for separating these memory material layers are formed in a single memory cell so as to store a multi-bit data. Besides, the multiple memory material layers may be made of different materials or have different thicknesses to distinguish different levels.

FIG. 1 is a cross-sectional view of a multi-level memory cell according to a first embodiment of the present invention. In the present embodiment, three memory material layers are disposed. However, the present invention is not limited thereto, and the number of the memory material layers can be determined according to the actual number of levels.

In the present embodiment, the multi-level memory cell includes a lower electrode 102, a dielectric layer 104, a first memory material layer 108, a first spacer 110, a second memory material layer 112, a second spacer 114, a third memory material layer 116, and an upper electrode 118.

The lower electrode 102 may be disposed on a substrate 100. The substrate 100 may be a silicon substrate, and the lower electrode 102 may be a conductive layer (metal or doped polysilicon, etc) or a doped region formed in the substrate 100.

The dielectric layer 104 is disposed on the lower electrode 102 and has an opening 106 for exposing the lower electrode 102. The dielectric layer 104 may be made of silicon oxide, silicon nitride, or silicon-oxy-nitride, etc.

The first memory material layer 108 is disposed in the opening 106 of the dielectric layer 104. The first memory material layer 108 may also selectively cover the dielectric layer 104. The first memory material layer 108 may also be disposed on the sidewall of the dielectric layer 104 exposed by the opening 106, namely, the first memory material layer 108 is located between the first spacer 110 and the dielectric layer 104. The first memory material layer 108 is made of a variable-resistance material or a phase-change material. The variable-resistance material includes a transition metal oxide, such as titanium oxide, hafnium oxide, zirconium oxide, nickel oxide, zinc oxide, or an alloy of foregoing compound. The phase-change material includes a chalcogenide, such as a metal alloy containing any one of antimony, germanium, tellurium, selenium, indium, and stannum, wherein the metal alloy contains two or more metal elements.

The first spacer 110 is disposed on the sidewall of the first memory material layer 108. The first spacer 110 may be made of silicon oxide, silicon nitride, or silicon-oxy-nitride, etc. The first spacer 110 separates the first memory material layer 108 and the second memory material layer 112 in the opening 106.

The second memory material layer 112 is disposed on the first memory material layer 108 and the first spacer 110. The second memory material layer 112 may also selectively cover the dielectric layer 104. The second memory material layer 112 is located between the second spacer 114 and the first spacer 110. The second memory material layer 112 is made of a variable-resistance material or a phase-change material. The variable-resistance material includes a transition metal oxide, such as titanium oxide, hafnium oxide, zirconium oxide, nickel oxide, zinc oxide, and an alloy of foregoing compound. The phase-change material includes a chalcogenide, such as a metal alloy containing any one of antimony, germanium, tellurium, selenium, indium, and stannum, wherein the metal alloy contains two or more metal elements.

The second spacer 114 is disposed on the sidewall of the second memory material layer 112. The second spacer 114 may be made of silicon oxide, silicon nitride, or silicon-oxy-nitride, etc. The second spacer 114 separates the second memory material layer 112 and the third memory material layer 116 in the opening 106.

The third memory material layer 116 is disposed on the second memory material layer 112 and the second spacer 114. The third memory material layer 116 may selectively cover the dielectric layer 104 or may also be in direct contact with the lower electrode 102. The third memory material layer 116 is located between the second spacer 114, the second memory material layer 112, and the upper electrode 118. The third memory material layer 116 is made of a variable-resistance material or a phase-change material. The variable-resistance material includes a transition metal oxide, such as titanium oxide, hafnium oxide, zirconium oxide, nickel oxide, zinc oxide, and an alloy of foregoing compound. The phase-change material includes a chalcogenide, such as a metal alloy containing at least one of antimony, germanium, tellurium, selenium, indium, and stannum, wherein the metal alloy contains two or more metal elements.

The upper electrode 118 is disposed on the third memory material layer 116. The upper electrode 118 may be a conductive layer made of a metal or doped polysilicon.

In the present embodiment, the first memory material layer 108, the second memory material layer 112, and the third memory material layer 116 may be made of the same material or different materials. The first memory material layer 108, the second memory material layer 112, and the third memory material layer 116 may have the same thickness or different thicknesses.

The dielectric layer 104, the first spacer 110, and the second spacer 114 may be made of the same material or different materials. The dielectric layer 104, the first spacer 110, and the second spacer 114 may have the same thickness or different thicknesses.

In the present invention, a plurality of memory material layers (108, 112, and 116) and spacers 110 and 114 for separating these memory material layers are formed in a single memory cell to store a multi-bit data in the single memory cell. Besides, the memory material layers may be made of different materials or have different thicknesses to distinguish different levels.

In a multi-level memory cell provided by the present invention, if spacers formed through a self-aligned process are served as dielectric layers for separating multiple memory material layers, steps in a photolithography process and the difficulty in photolithography exposure are reduced.

FIGS. 2A~2D are diagrams illustrating operations of a multi-level memory cell according to the first embodiment of the present invention. In FIGS. 2A~2D, like reference numerals refer to the like elements throughout and the descriptions of these elements are omitted.

Below, the operation of a multi-level memory cell in the present invention will be described. In following description, the operation of a phase-change memory cell will be described as an example, namely, the first memory material layer 108, the second memory material layer 112, and the third memory material layer 116 are made of phase-change materials.

Figure 2A:
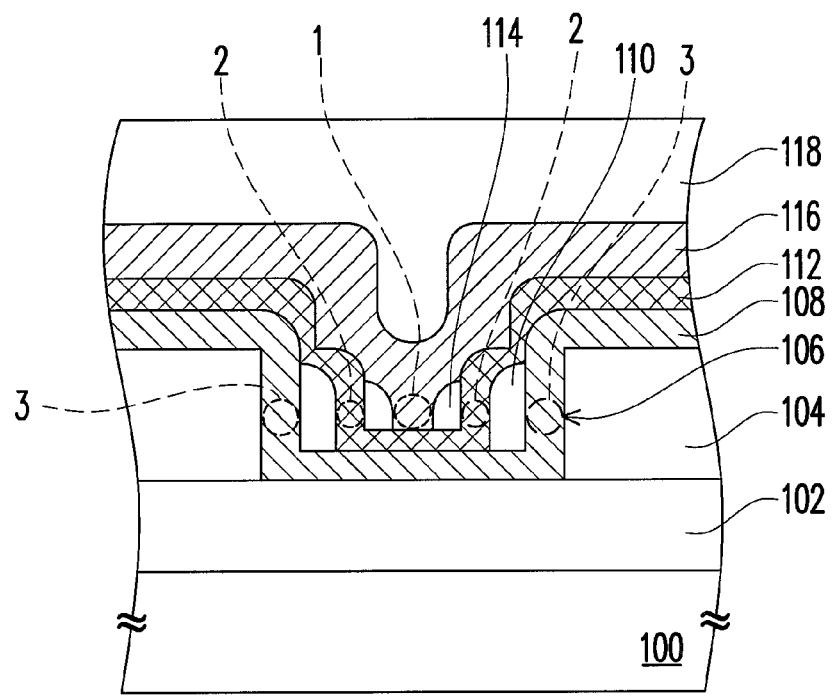
FIGS. 2A~2D are diagrams illustrating operations of a multi-level memory cell according to the first embodiment of the present invention.

As shown in FIG. 2A, the initial state of the multi-level memory cell is assumed to be 00, and the resistance thereof is an initial resistance (set state resistance) with the positions 1, 2, and 3 connected in parallel.

Figure 2B:
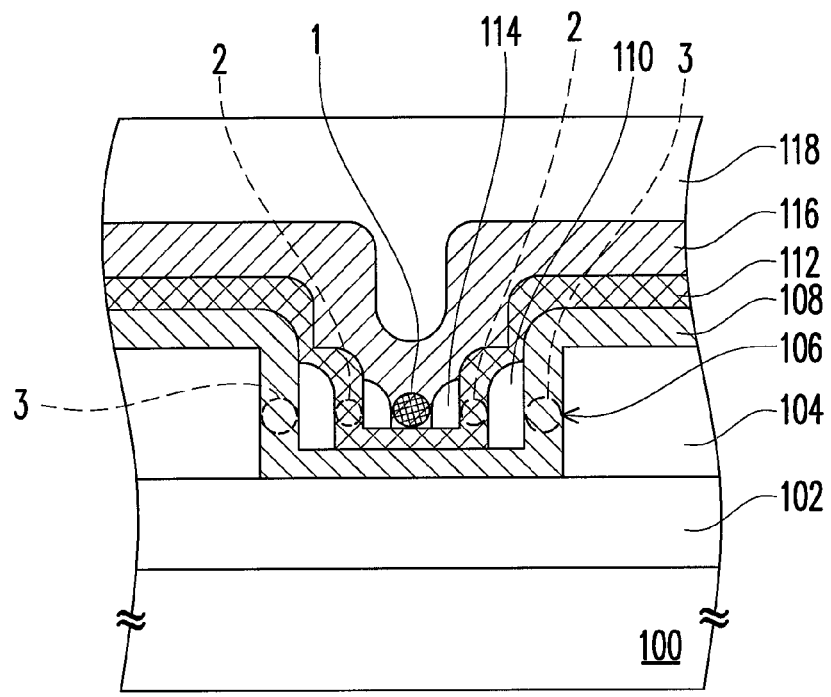

During the first stage of the operation (to program the multi-level memory cell into state 01), the resistances detected at the positions 1, 2, and 3 are different, and accordingly the detected current densities at these positions are also different. Because the highest current density is detected at the position 1, the position 1 is locally heated so that the phase-change layer (the third memory material layer 116) at the position 1 is turned into an amorphous state, namely, a reset state. As shown in FIG. 2B, the operation in the state 01 is to connect the position 1 (the reset state resistance), the position 2 (the set state resistance), and the position 3 (the set state resistance) in parallel.

Figure 2C:
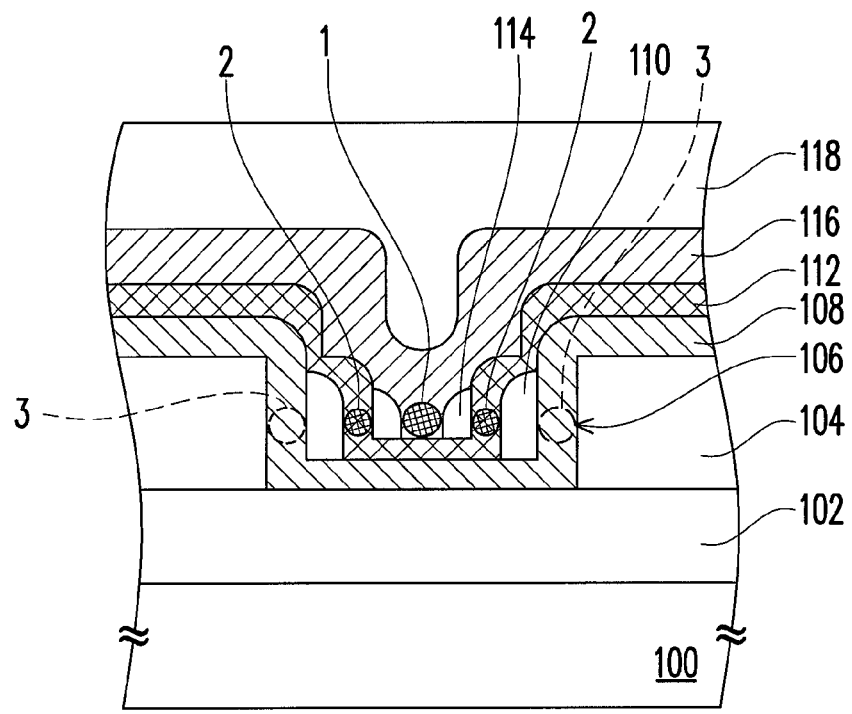

During the second stage of the operation (to program the multi-level memory cell into state 10), since the highest resistance is detected at the position 1, most of the current passes through the positions 2 and 3, and a local high current density area is formed at the position 2. As a result, the position 2 is locally heated so that the phase-change layer (the second memory material layer 112) at the position 2 is turned into an amorphous state, namely, the reset state. As shown in FIG. 2C, the operation in the state 10 is to connect the position 1 (the reset state resistance), the position 2 (the reset state resistance), and the position 3 (the set state resistance) in parallel.

Figure 2D:
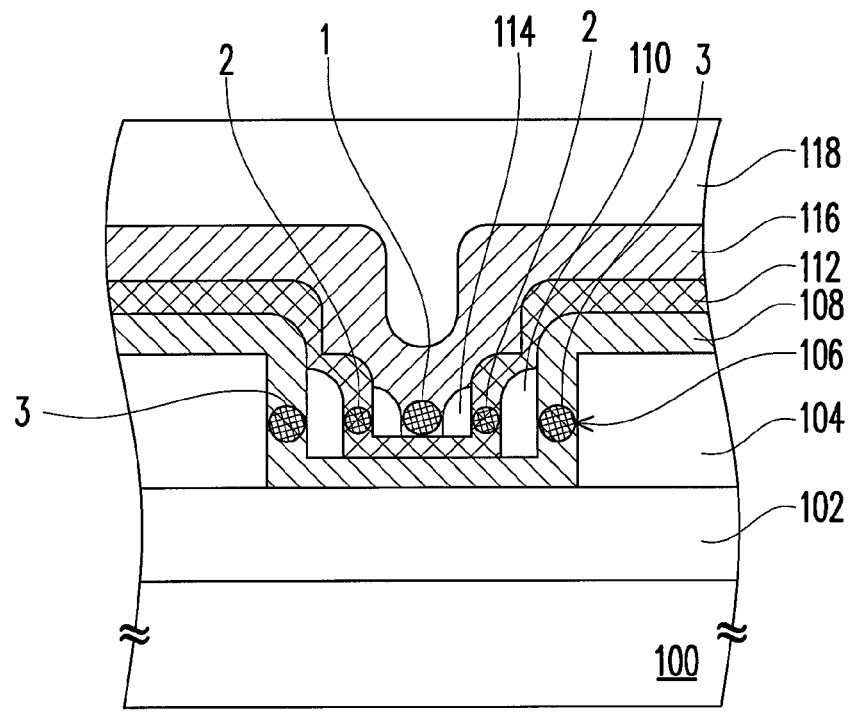

Finally, during the third stage of the operation (to program the multi-level memory cell into state 11), since the high resistance is detected at the positions 1 and 2, most of the current passes through the position 3. As a result, the position 3 is locally heated and the phase-change layer (the first memory material layer 108) at the position 3 is turned into an amorphous state, namely, the reset state. As shown in FIG. 2D, the operation in the state 11 is to connect the position 1 (the reset state resistance), the position 2 (the reset state resistance), and the position 3 (the reset state resistance) in parallel.

FIGS. 3A~3D are flowcharts of a manufacturing method of a multi-level memory cell according to an embodiment of the present invention.

Figure 3A:
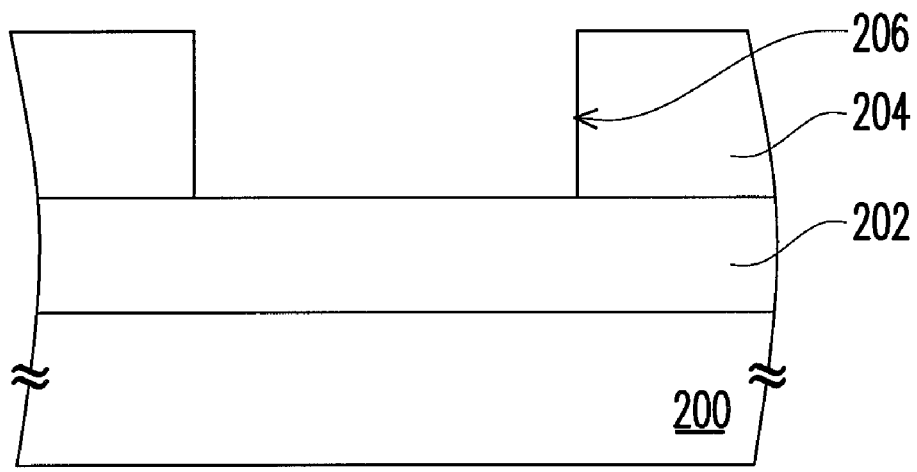
FIGS. 3A~3D are flowcharts of a manufacturing method of a multi-level memory cell according to an embodiment of the present invention.

Referring to FIG. 3A, first, a substrate 200 is provided. The substrate 200 may be a silicon substrate. A lower electrode 202 is already formed in the substrate 200. The lower electrode 202 may be a conductive layer (metal or doped polysilicon, etc) or a doped region formed in the substrate 200. The lower electrode 202 may be formed through physical vapour deposition (PVD) or chemical vapour deposition (CVD) if the lower electrode 202 is a conductive layer (metal or doped polysilicon, etc). The lower electrode 202 may be formed through ion implantation if the lower electrode 202 is a doped region formed in the substrate 200.

Then, a dielectric layer 204 is formed on the substrate 200. The dielectric layer 204 may be made of silicon oxide, silicon nitride, or silicon-oxy-nitride and formed through CVD. After that, an opening 206 is formed in the dielectric layer 204 to expose part of the lower electrode 202. The opening 206 may be formed in the dielectric layer 204 through lithography and etching processes.

Figure 3B:
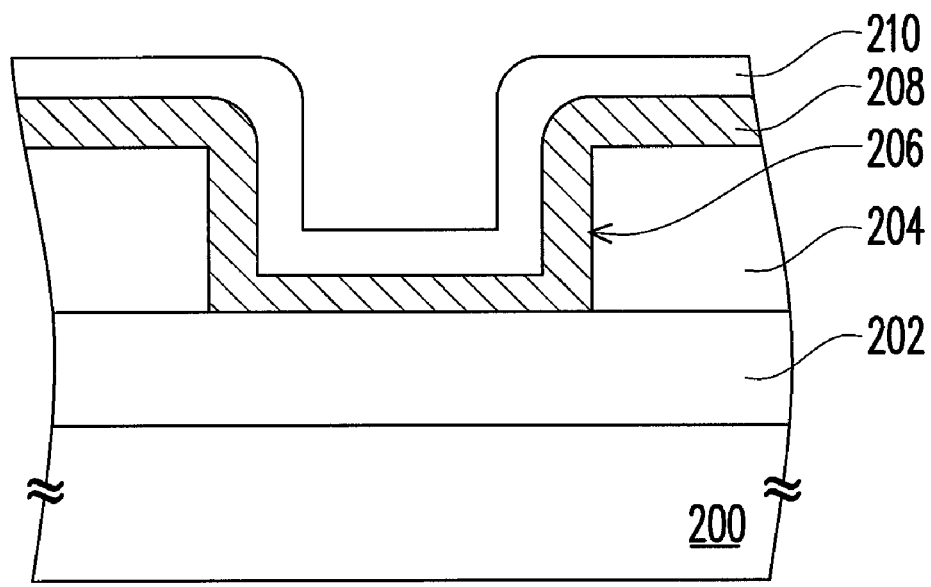

Referring to FIG. 3B, a first memory material layer 208 is formed on the substrate 200. The first memory material layer 208 is made of a variable-resistance material or a phase-change material. The variable-resistance material includes a transition metal oxide, such as titanium oxide, hafnium oxide, zirconium oxide, nickel oxide, zinc oxide, and an alloy of foregoing compound. The phase-change material includes a chalcogenide, such as a metal alloy containing any one of antimony, germanium, tellurium, selenium, indium, and stannum, wherein the metal alloy contains two or more metal elements. The first memory material layer 208 may be formed through PVD or CVD.

After that, a dielectric layer 210 is formed on the first memory material layer 208. The dielectric layer 210 may be made of silicon oxide, silicon nitride, or silicon-oxy-nitride and formed through CVD.

Figure 3C:
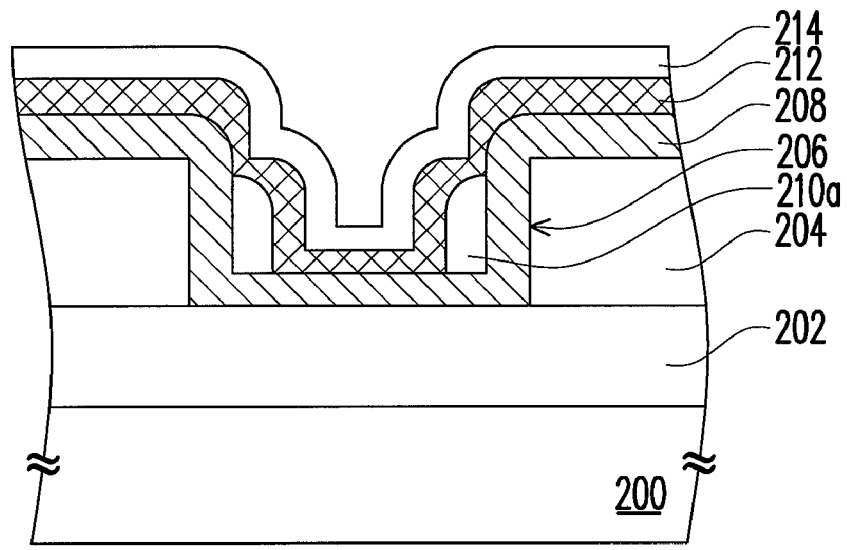

Referring to FIG. 3C, the dielectric layer 210 is etched back to form a first spacer 210a. While etching back the dielectric layer 210, part of the first memory material layer 208 may be selectively removed to expose the lower electrode 202 or the dielectric layer 204.

Next, a second memory material layer 212 is formed on the first memory material layer 208 and the first spacer 210a. The second memory material layer 212 is made of a variable-resistance material or a phase-change material. The variable-resistance material includes a transition metal oxide, such as titanium oxide, hafnium oxide, zirconium oxide, nickel oxide, zinc oxide, and an alloy of foregoing compound. The phase-change material includes a chalcogenide, such as a metal alloy containing any one of antimony, germanium, tellurium, selenium, indium, and stannum, wherein the metal alloy contains two or more metal elements. The second memory material layer 212 may be formed through PVD or CVD.

After that, a dielectric layer 214 is formed on the second memory material layer 212. The dielectric layer 214 may be made of silicon oxide, silicon nitride, or silicon-oxy-nitride and formed through CVD.

Figure 3D:
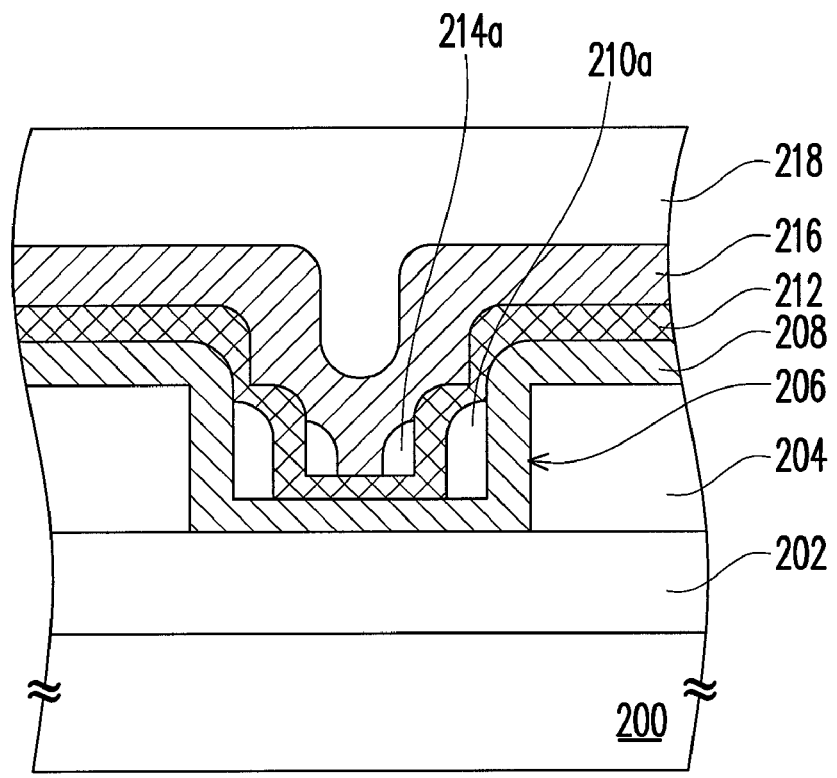

Referring to FIG. 3D, the dielectric layer 214 is etched back to form a second spacer 214a. While etching back the dielectric layer 214, part of the second memory material layer 212 may be selectively removed to expose the lower electrode 202 or the dielectric layer 204.

Next, a third memory material layer 216 is formed on the second memory material layer 212 and the second spacer 214a. The third memory material layer 216 is made of a variable-resistance material or a phase-change material. The variable-resistance material includes a transition metal oxide, such as titanium oxide, hafnium oxide, zirconium oxide, nickel oxide, zinc oxide, or an alloy of foregoing compound. The phase-change material includes a chalcogenide, such as a metal alloy containing any one of antimony, germanium, tellurium, selenium, indium, and stannum, wherein the metal alloy contains two or more metal elements. The third memory material layer 216 may be formed through PVD or CVD.

Thereafter, an upper electrode 218 is formed on the third memory material layer 216. The upper electrode 218 may be a conductive layer (metal or doped polysilicon, etc) and formed through PVD or CVD.

In the present embodiment, the first memory material layer 208, the second memory material layer 212, and the third memory material layer 216 may be made of the same material or different materials. The first memory material layer 208, the second memory material layer 212, and the third memory material layer 216 may have the same thickness or different thicknesses.

In the present embodiment, the dielectric layer 204, the first spacer 210a, and the second spacer 214a may be made of the same material or different materials.

In the manufacturing method of a multi-level memory cell provided by the present invention, because spacers formed through a self-aligned process are served as dielectric layers for separating multiple memory material layers, steps in a photolithography process and the difficulty in photolithography exposure are reduced and accordingly the manufacturing cost is also reduced.

As described above, the present invention has at least following advantages.

1. A multi-bit data can be stored in a single multi-level memory cell provided by the present invention.

2. In a multi-level memory cell provided by the present invention, a plurality of memory material layers and spacers for separating these memory material layers are formed in a single memory cell so as to store a multi-bit data. Besides, the memory material layers may be made of different materials or have different thicknesses to distinguish different levels.

3. In the manufacturing method of a multi-level memory cell provided by the present invention, steps in a photolithography process and the difficulty in photolithography exposure are reduced and accordingly the manufacturing cost is also reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-level memory cell, comprising:
a lower electrode, disposed on a substrate;
a first dielectric layer, disposed on the substrate, and having an opening which exposes the lower electrode;
a plurality of memory material layers, stacked on a sidewall of the first dielectric layer exposed by the opening, and electrically connected to the lower electrode, wherein the memory material layers directly contact with each other;
a plurality of second dielectric layers, respectively disposed between every adjacent two of the memory material layers, and located on the sidewall of the first dielectric layer exposed by the opening; and
an upper electrode, disposed on the memory material layers.

2. The multi-level memory cell according to claim 1, wherein a number of the memory material layers is equal to or greater than three.

3. The multi-level memory cell according to claim 1, wherein a material of each of the memory material layers comprises a variable-resistance material or a phase-change material.

4. The multi-level memory cell according to claim 3, wherein the variable-resistance material comprises a transition metal oxide.

5. The multi-level memory cell according to claim 4, wherein the variable-resistance material is selected from the group consisting of titanium oxide, hafnium oxide, zirconium oxide, nickel oxide, zinc oxide, and an alloy of titanium oxide, hafnium oxide, zirconium oxide, nickel oxide, and zinc oxide.

6. The multi-level memory cell according to claim 3, wherein the phase-change material comprises a chalcogenide.

7. The multi-level memory cell according to claim 6, wherein the phase-change material is a metal alloy containing any one of antimony, germanium, tellurium, selenium, indium, and stannum, and the metal alloy contains at least two metal elements.

8. The multi-level memory cell according to claim 1, wherein each of memory material layers are made of the same material or are made of a different material.

9. The multi-level memory cell according to claim 1, wherein each of second dielectric layers are made of the same or are made of a different material.

10. The multi-level memory cell according to claim 1, wherein
the memory material layers comprise a first memory material layer, a second memory material layer, and a third memory material layer;
the second dielectric layers comprise a first spacer and a second spacer;
the first memory material layer is disposed in the opening of the first dielectric layer;
the first spacer is disposed on a sidewall of the first memory material layer;
the second memory material layer is disposed on the first memory material layer and the first spacer;
the second spacer is disposed on a sidewall of the second memory material layer;
the third memory material layer is disposed on the second memory material layer and the second spacer; and
the upper electrode is disposed on the third memory material layer.

11. The multi-level memory cell according to claim 10, wherein the third memory material layer is in direct contact with the lower electrode.

12. The multi-level memory cell according to claim 10, wherein the materials of the first memory material layer, the second memory material layer, and the third memory material layer comprise a variable-resistance material or a phase-change material.

13. The multi-level memory cell according to claim 12, wherein the variable-resistance material comprises a transition metal oxide.

14. The multi-level memory cell according to claim 13, wherein the variable-resistance material is selected from the group consisting of titanium oxide, hafnium oxide, zirconium oxide, nickel oxide, zinc oxide, and an alloy of titanium oxide, hafnium oxide, zirconium oxide, nickel oxide, and zinc oxide.

15. The multi-level memory cell according to claim 12, wherein the phase-change material comprises a chalcogenide.

16. The multi-level memory cell according to claim 15, wherein the phase-change material is a metal alloy containing any one of antimony, germanium, tellurium, selenium, indium, and stannum, and the metal alloy contains at least two metal elements.

17. The multi-level memory cell according to claim 10, wherein the first memory material layer, the second memory material layer, and the third memory material layer are made of the same material or are made of a different material.

18. The multi-level memory cell according to claim 10, wherein the first dielectric layer, the first spacer, and the second spacer are made of the same material or are made of a different material.

19. The multi-level memory cell according to claim 10, wherein the first memory material layer, the second memory material layer, and the third memory material layer further cover the first dielectric layer.

20. A multi-level memory cell, comprising:
a lower electrode, disposed on a substrate;
a first dielectric layer, disposed on the substrate, and having an opening which exposes the lower electrode;

a plurality of memory material layers, stacked on a sidewall of the first dielectric layer exposed by the opening, and electrically connected to the lower electrode;

a plurality of second dielectric layers, respectively disposed between every adjacent two of the memory material layers, and located on the sidewall of the first dielectric layer exposed by the opening;

an upper electrode, disposed on the memory material layers; and a plurality of phase-change positions, disposed between the first dielectric layer and an adjacent second dielectric layer, and between the second dielectric layers.

* * * * *